US010014398B2

(12) United States Patent
Donkers et al.

(10) Patent No.: US 10,014,398 B2
(45) Date of Patent: Jul. 3, 2018

(54) BIPOLAR TRANSISTOR DEVICE AND METHOD OF FABRICATION

(71) Applicant: NXP B.V., Eindhoven (NL)

(72) Inventors: Johannes Donkers, Valkenswaard (NL); Viet Thanh Dinh, Leuven (BE); Tony Vanhoucke, Bierbeek (BE); Evelyne Gridelet, Omal (BE); Anco Heringa, Waalre (NL); Dirk Klaassen, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/494,868

(22) Filed: Apr. 24, 2017

(65) Prior Publication Data

US 2017/0229564 A1    Aug. 10, 2017

Related U.S. Application Data

(63) Continuation of application No. 14/656,359, filed on Mar. 12, 2015.

(30) Foreign Application Priority Data

Mar. 12, 2014    (EP) .................................. 14159267

(51) Int. Cl.
| | | |
|---|---|---|
| H01L 29/66 | (2006.01) |
| H01L 29/737 | (2006.01) |
| H01L 29/06 | (2006.01) |
| H01L 29/40 | (2006.01) |

(52) U.S. Cl.
CPC ........ *H01L 29/737* (2013.01); *H01L 29/0649* (2013.01); *H01L 29/407* (2013.01); *H01L 29/66242* (2013.01)

(58) Field of Classification Search
CPC ................. H01L 29/205; H01L 29/407; H01L 29/66242; H01L 29/6625; H01L 29/735; H01L 29/737; H01L 29/7378; H01L 27/1022; H01L 27/082; H01L 29/0817; H01L 29/66234

USPC .......... 257/197, 526, 565, 330, 95; 438/207, 438/313

See application file for complete search history.

(56) References Cited

U.S. PATENT DOCUMENTS

| | | | |
|---|---|---|---|
| 4,704,368 A | * | 11/1987 | Goth ..................... H01L 21/762 257/E21.545 |
| 6,573,539 B2 | | 6/2003 | Huang |
| 7,132,344 B1 | | 11/2006 | Knorr |
| 8,026,146 B2 | | 9/2011 | Donkers et al. |
| 8,159,024 B2 | | 4/2012 | Chow et al. |
| 9,029,952 B2 | | 5/2015 | Hung et al. |
| 9,324,846 B1 | | 4/2016 | Camillo-Castillo et al. |

(Continued)

FOREIGN PATENT DOCUMENTS

CN    102522425 A    6/2012

OTHER PUBLICATIONS

Geynet, B., et al; "High-Voltage HBTs Compatible with High-Speed SiGe BiCMOS Technology"; IEEE Topical Meeting on Silicon Monolithic Integrated Circuits in RF Systems, Orlando, FL, USA pp. 210-213 (2008).

(Continued)

*Primary Examiner* — Mohammed Shamsuzzaman (57) ABSTRACT

The disclosure relates to bipolar transistor devices and a method of fabricating the same. The device comprises a field plate, in an isolation region adjacent to a base-collector junction of said active region. The isolation region comprises a gate terminal arranged to be biased independently of a collector, base or emitter terminal of said transistor.

5 Claims, 9 Drawing Sheets

(56) References Cited

U.S. PATENT DOCUMENTS

| | | | |
|---|---|---|---|
| 2001/0012655 A1* | 8/2001 | Nordstom | H01L 21/02164 438/239 |
| 2006/0011943 A1* | 1/2006 | Howard | H01L 29/0649 257/197 |
| 2010/0019304 A1* | 1/2010 | Minami | H01L 27/1022 257/314 |
| 2010/0022056 A1* | 1/2010 | Donkers | H01L 29/407 438/207 |
| 2013/0075746 A1 | 3/2013 | Mallikarjunaswamy et al. | |
| 2013/0099351 A1* | 4/2013 | Chen | H01L 29/407 257/526 |
| 2014/0312356 A1 | 10/2014 | Vanhoucke et al. | |
| 2014/0327110 A1 | 11/2014 | Gridelet et al. | |

OTHER PUBLICATIONS

Greenberg, D.R., et al; "Large-Signal Performance of High-BV CEO Graded Epi-Base SiGe HBTs at Wireless Frequencies"; International Electron Devices Meeting, Technical Digest, Washington, DC, USA; pp. 799-802 (Dec. 1997).

Hueting, Raymond J.E. et al; "A New Trench Bipolar Transistor for RF Applications"; IEEE Transactions on Electron Devices, vol. 51, No. 7; pp. 1108-1113 (Jul. 2004).

Malai, J., et al; "A New Sub-Micron 24 V SiGe:C Resurf HBT"; Proceedings of the IEEE 2004 International Symposium on Power Semiconductor Devices & ICs, Kitakyshu; pp. 33-36 (May 2004).

Mertens, H., et al; "A New Sub-Micron 24 V SiGe:C Resurf HBT"; 16th International Symposium on Power Semiconductor Devices and ICs; IEEE; pp. 33-36 (May 2004).

Preisler, E.J., et al; "Integration of a 5.5V BV CEO SiGe HBT within a 200 GHz SiGe BiCMOS process flow"; IEEE Bipolar/BiCMOS Circuits and Technology Meeting, Boston, MA, USA; pp. 202-205 (Sep. 2007).

Extended European Search Report for corresponding EP Application No. 14159267.5 dated Sep. 1, 2014, 6 pages.

\* cited by examiner

BIPOLAR TRANSISTOR DEVICE AND METHOD OF FABRICATION

CROSS-REFERENCE TO RELATED APPLICATION(S)

The present application is a continuation of co-pending U.S. patent application Ser. No. 14/656,359, entitled "BIPOLAR TRANSISTOR DEVICE AND METHOD OF FABRICATION" filed on Mar. 12, 2015, which claims priority to European Patent Application No. EP 14159267.5, filed on Mar. 12, 2014, the entirety of which are herein incorporated by reference.

FIELD

The disclosure relates to bipolar transistor devices. The disclosure also relates to a method of manufacturing a bipolar transistor. In particular, the disclosure relates to integrated circuits and radio frequency (RF) power amplifiers comprising such transistor devices.

BACKGROUND

In high-speed data communication, for example multimedia communication, data transmitters and receivers are required to work at high frequencies, for example in the Giga Hertz (GHz) RF range. In such data transmitters and receivers, RF power amplifiers are an important element to create sufficient signal power with high linearity at RF frequencies.

Bipolar transistors such as Heterojunction bipolar transistor HBTs are preferred to CMOS based devices for power amplifier applications due to their superior performance, such as higher output signal power, high power density and high linearity, at RF frequencies. On the one hand, III-V based transistors are preferred over Si based devices due to their higher breakdown voltage, higher maximum operating frequency and higher power density. On the other hand however Si based HBT devices, such as SiGe are more cost effective and are more easily integrated into for example larger scale system on chip than the III-V based devices, albeit at the cost of lower breakdown voltages and lower output powers, when compared to such III-V based devices.

In traditional SiGe based HBT devices attempts have been made to increase the breakdown voltage by implementing collector implants. However increasing the breakdown voltage in this way requires a trade-off of lowering the cut-off frequency which is the high-frequency figure of merit of a HBT device. This trade-off can be explained by the so-called Johnson limit. The Johnson limit equates to the product of peak current gain cut-off frequency $f_T$ and the collector-emitter breakdown voltage $BV_{CEO}$. These characteristics are typically controlled by controlling the amount of doping in the collector of a particular HBT device. A high collector doping level on the one hand increases $f_T$ because it postpones the so-called Kirk effect, but on the other hand it decreases $BV_{CEO}$ because it increases the local electric field at the collector.

The trade-off between breakdown voltage and cut-off frequency may limit the application of such HBT devices. For example such devices may be unsuitable for RF amplifiers which are required to operate at medium to high power and high linearity at sufficiently high frequencies in the GHz range.

Attempts to improve device performance by reducing the effects of the above mentioned trade-off include for example devices comprising so-called gated bottom up-collectors or gated lateral collectors. Such devices attempt to reshape the electric field distribution to effectively increase the breakdown voltage without lowering the cut-off frequency $f_T$.

For devices comprising gated bottom up-collectors, complexities in the device processing, for example the processing of shallow trench isolation regions with different depths, may result in increased processing time and increased device cost.

For gated lateral collectors which do not comprise a shallow trench isolation (STI) region, a very high localised electric field, in the region of 600 KVcm$^{-1}$ to 800 KVcm$^{-1}$, may occur at the junction of the base and the collector. This electric field, commonly known as a field spike, may result in device reliability issues for example, device breakdown due to impact ionization. Whenever the field is higher than critical field for the device material (for example 500 kV/cm in Silicon), the impact ionization (generating electron/holes) is large enough to damage the device. Such a field spike is therefore generally unwanted.

Generally therefore known devices may have low breakdown voltages and low operating frequencies or may suffer from the occurrence of field spikes and the associated problems.

SUMMARY

There is provided a method of manufacturing a bipolar transistor, comprising: forming an isolation region in a substrate, said isolation region adjacent to an active region of said bipolar transistor; forming a dielectric on respective side walls and a base of said isolation region; and depositing a semiconductor material in said isolation region so as to form a field plate, wherein said field plate is adjacent to a base-collector junction of said active region.

According to an embodiment forming said dielectric may comprise etching a dielectric material to define a gate dielectric in said isolation region. Alternatively, forming said dielectric may comprise depositing a dielectric material to define a gate dielectric in said isolation region. The semiconductor material deposited in said isolation region may be a polycrystalline semiconductor material, wherein the polycrystalline semiconductor material may comprise a base or an emitter of said bipolar transistor.

According to an embodiment forming said gate dielectric and said semiconductor material may define a gate terminal of said transistor. Said gate terminal may be arranged to be biased independently of a collector, base or emitter terminal of said transistor.

There is also provided a bipolar transistor, comprising: a substrate comprising an isolation region, said isolation region adjacent to an active region of said bipolar transistor; an dielectric on respective side walls and base of said first isolation region; a field plate formed of a semiconductor material in said isolation region, wherein said field plate is adjacent to a base-collector junction of said active region.

According to an embodiment said dielectric may define a gate dielectric in said isolation region. Said semiconductor material may be a polycrystalline semiconductor material. The polycrystalline semiconductor material comprises a base of said bipolar transistor. Alternatively the polycrystalline semiconductor material may comprise an emitter of said bipolar transistor.

According to an embodiment the gate dielectric and said semiconductor material may define a gate terminal of said transistor. Said gate terminal may be arranged to be biased independently of a collector, base or emitter terminal of said transistor.

There is also provided an RF power amplifier comprising one or more of said bipolar transistors.

There is further provided an integrated circuit comprising one or more of said bipolar transistors.

DESCRIPTION OF THE DRAWINGS

In the figures and description like reference numerals refer to like features. The invention is described further hereinafter by way of example only with reference to the accompanying drawings in which.

In the following the skilled person will appreciate that in order to provide the transistor function a collector region and an emitter region of an exemplary HBT are formed with a material of a first conductivity type, whereas a base region of an exemplary HBT is formed of a material of second conductivity type that is different to the first conductivity type. The first conductivity type may be n-type and the second conductivity type may be p-type. Alternatively, the first conductivity type may be p-type and the second conductivity type may be n-type.

Although the present disclosure is applicable to any bipolar transistor design, such as for example a HBT, the following disclosure will be explained by way of non-limiting examples to a HBT produced in a CMOS process with the additional process steps for producing a bipolar transistor, such as for example a BiCMOS process.

Figure 1A:
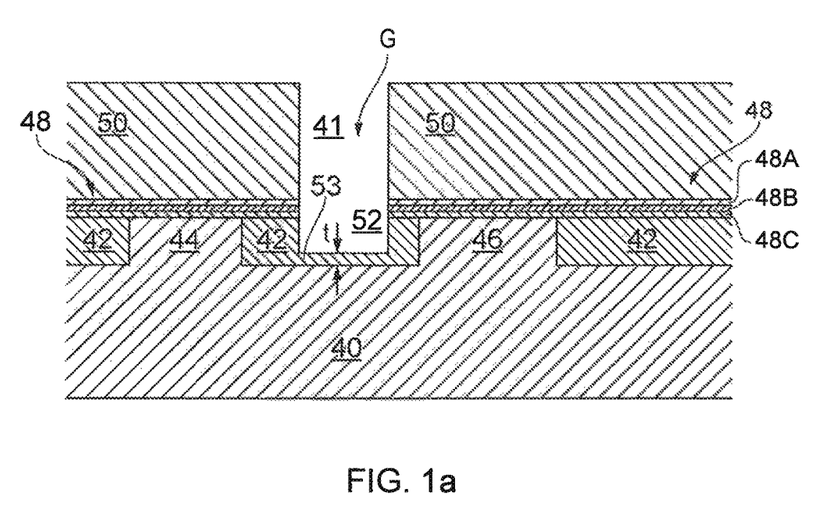
FIG. 1a illustrates a schematic cross-section of an embodiment after the step of removing STI oxide and formation of a gate dielectric layer.

As a starting point for the process of forming a HBT device of the structure as discussed further below, a semiconductor wafer, comprising a silicon substrate 40, with isolation regions such as shallow trench isolation (STI) regions 42, formed in the substrate 40 is provided as illustrated in FIG. 1a. Prior to this, the STI regions 42 may be formed in the substrate 40 by any appropriate technique, such as for example by etching trenches in the substrate 40, followed by filling the trenches by depositing, for example, a High Density Plasma (HDP) oxide. The STI regions 42 may define a sinker region 44 and an active bipolar region 46 in the substrate 40. The active bipolar region 46, is that region where the transistor function is defined, that is N—collector, P—base N—emitter or PNP.

Following formation of the STI regions 42, a silicide protect layer 48 is provided on the substrate such that it covers the STI regions 42, the DN (sinker) region 44 and the active bipolar region 46. Starting from the lowest layer, that is the layer in contact with the STI regions 42, the sinker region 44 and the active bipolar region 46, the silicide protect layer 48 is generally formed of a layer stack comprising: an oxide layer 480; a nitride layer 48B and a polysilicon layer 48A. In particular, for example the silicide protect layer 48 may be formed of an oxide layer 48C such as Tetraethyl orthosilicate (TEOS), a nitride layer 48B such as silicon nitride and a polysilicon layer 48A such as amorphous silicon. The main purpose of the silicide protect layer 48 may be to protect the areas of the wafer going forward into bipolar processing already fabricated in CMOS processes (such as for example STI regions, sinker regions and/or active bipolar regions) from damage during the bipolar processes.

A gate trench G may be formed by applying a photo resist layer 50 over the silicide protect layer 48, with the exception of a first window area 41 defined over the STI region 42 between the sinker region 44 and the active bipolar region 46. Following the application of the photo resist layer 50 a dry etch may be used to remove the silicide protect layer 48 corresponding to the first window area 41 defined in the photo resist layer 50. Following removal of the silicide protect layer 48, the dry etch may then remove part of the oxide in the STI region 42 corresponding to the first window area 41 in the photo resist layer 50, so as to form a trench 52 in the STI region 42, for formation of the gate trench G. The dry etch may be any suitable dry etch process such as carbon tetrafluoromethane ($CF_4$) plasma etch.

The oxide, which may be a High Density Plasma (HDP) oxide as mentioned above, in the STI region 42 is etched to a vertical thickness t, that is the thickness of the oxide remaining in the bottom STI region. This remaining oxide thickness t defines the gate dielectric layer 53 thickness (or in other terms the oxide layer thickness) of the gate of the HBT device. The vertical thickness t, is the thickness of the oxide between the bottom of the as etched trench 52 and the silicon substrate 40. For example the thickness t may be approximately 150 nm. Typically the lateral width of the window area in the photo resist layer 50 would be approximately 200 to 300 nm.

The thickness t may be controlled by a time based etch such that there may be a variation in thickness t of less than approximately 30 nm across the width of the wafer, dependent on the specific etch used. This variation in thickness may result in a variation in the HBT collector-base open-emitter breakdown voltage ($BV_{CBO}$) of between 2 and 3 volts. The variation of voltage is due to the fact that there is a trade-off between the dielectric thickness and the effectiveness to influence the electric field below it. The thinner the dielectric the greater the electric field that may be suppressed. However, the thinner the dielectric, the higher the risk of breakdown of the dielectric.

Figure 1B:
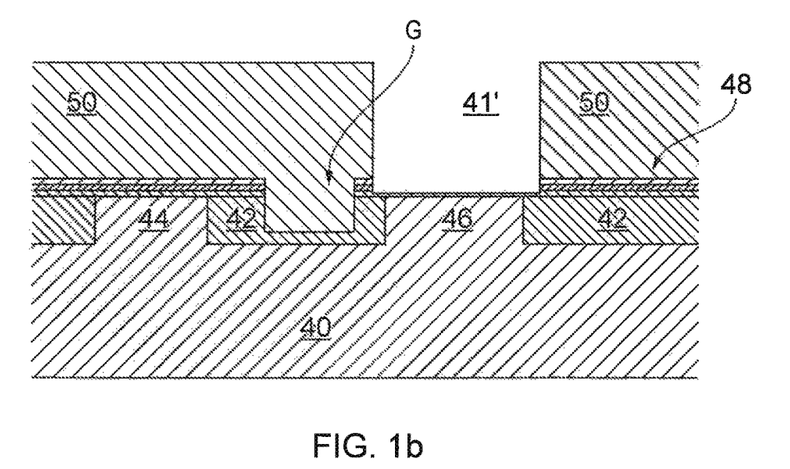
FIG. 1b illustrates a schematic cross-section after the step of removing the silicide protect layer.

Following formation of the gate dielectric layer 53, the silicide protect layer 48 above the active bipolar region 46 is removed. Referring to FIG. 1b, before the silicide protect layer 48 is removed, the as etched gate trench G in the STI region 42 is covered with photo resist 50 and also a second window area 41' is formed in the photo resist 50 over the active bipolar region 46. The width of the second window area 41' is such that it is wider than the width of the active bipolar region 46 so as to minimize parasitic capacitances between base dopant out-diffusion into the collector mainly. The silicide protect layer 48 may then be removed by etching the polysilicon layer 48A and the nitride layer 48B with a dry etch, such as a time based dry etch process for example, a $CF_4$-based etch where the selectivity of the etch may be influenced by addition of $O_2$, $N_2$, $H_2$. The etch may be stopped by the oxide layer 48C. To remove the oxide layer 48C a wet etch such as a hydrofluoric acid (HF) etch may be used. Removal of the oxide layer 48C exposes the material forming the active bipolar region 46, which may for example be the Si substrate 40 of the HBT device.

Following removal of the silicide protect layer 48 and also the removal of the photo resist 50, the next step is base epitaxy, whereby the base terminal 56, 56' of the HBT device is formed by epitaxial growth of a suitable semiconductor material. The base 56, 56' may be formed of any appropriate semiconductor material such as for example SiGe. The photo resist 50 is removed by any appropriate process as understood by the skilled person.

Figure 1C:
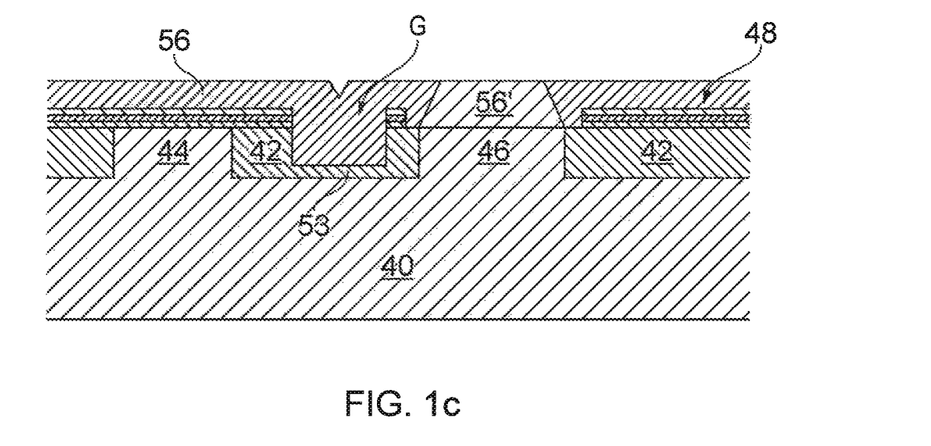
FIG. 1c illustrates a schematic cross-section of the wafer after the step of base epitaxy.

With reference to FIG. 1c, the suitable semiconductor material 56, 56', such as for example SiGe, is grown to form a base of the device. However, with the exception of growth over the exposed material of the active bipolar region 46, which will be a crystalline base 56', the growth of the base will be polycrystalline 56. The crystalline growth 56' over the active bipolar region 46 may be due to for example a lattice match with the for example Si lattice of the active bipolar material.

The remainder of the polycrystalline 56 base layer growth may be due to amorphous layer of the silicide protect layer 48 and oxide layer forming the gate dielectric layer 53 in the STI region 42. As a result of the epitaxy, the gate trench formed in the STI region 42, as discussed above, is filled with a polycrystalline 56 base layer. Depending on the width of the gate trench epitaxy in the gate trench G may result in conformal filling of the gate trench with the polycrystalline base layer 56 leaving some topography thereon. Alternatively, when the width of the epitaxy in the gate trench is twice the deposited layer thickness filling of the trench may be such that it is morphologically even. Filling of the gate trench G with the polycrystalline 56 base layer forms a field plate in the gate of the HBT device. As a result of the oxide layer gate dielectric layer 53 being formed proximal to the base-collector junction (that is the boundary of the crystalline base 56' and active bipolar region 46 forming the collector) field spikes may be reduced or removed. Subsequent deposition of deposited base polysilicon 60 material (discussed below) completes formation of the field plate.

The base polycrystalline 56 growth step may be performed at between 550 and 625 degrees Celsius, which results in a low growth rate, and therefore thin epitaxial layers and also in the case of SiGe material, high Ge incorporation. A typical of the base layer stack may be formed of ~10 nm intrinsic Si, followed by ~20 nm intrinsic SiGe:C, followed by ~5 nm B-doped SiGe:C, followed by ~10 nm i-SiGe:C, followed by ~50 nm B-doped Si. The carbon is included at approximately ~0.2% to suppress diffusion of the boron (B) during thermal steps later on in the process.

Figure 1D:
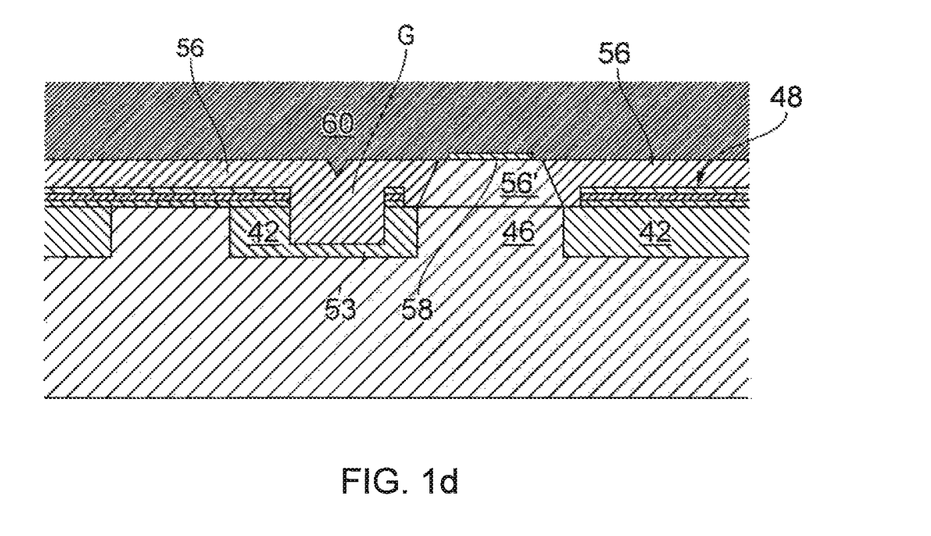
FIG. 1d illustrates a schematic cross-section of the wafer after the step of base polysilicon deposition.
Figure 1E:
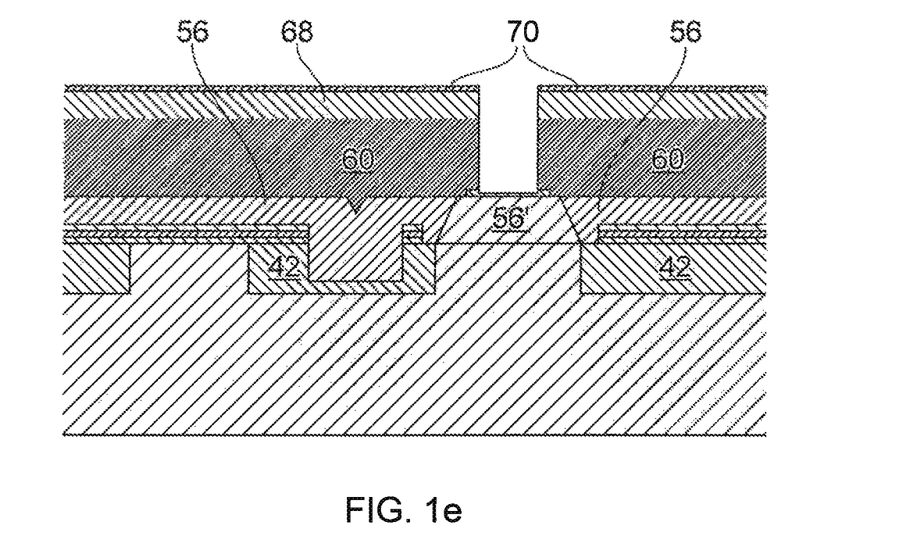
FIG. 1e illustrates a schematic cross-section of the wafer after the step of emitter window formation.

As shown in FIG. 1d, following base polycrystalline 56 growth, an etch protect layer 58 is formed on the crystalline layer 56' over the active bipolar region 46. The etch protect layer 58 may any appropriate material, for example a silicon oxide such as TEOS. The etch protect layer 58 may be formed on the crystalline layer 56' by any appropriate method, such as for example by patterning. Following formation of the etch protect layer 58, any topography in the polycrystalline 56 base layer will be filled with the deposited base polysilicon 60 material. Following deposition of the base polysilicon material 60 an emitter window 62 may be formed as shown for example in FIG. 1e. A base oxide layer 68 is deposited on the base polysilicon material 60 and this is followed by a nitride layer 70, such as $Si_3N_4$, to protect the oxide layer 68 below during subsequent processing steps such as for example etching of the emitter window 62 as discussed below. The emitter window 62 is formed by etching a trench in the base polysilicon material 60 above the crystalline growth 56' over the active bipolar region 46. The etching of the emitter window 62, for example by an appropriate dry etch, will terminate at the etch protect layer 58. This dry etch may serve as an endpoint trigger for patterning the stack of layers. After completion of the etch the photoresist is stripped.

Figure 1F:
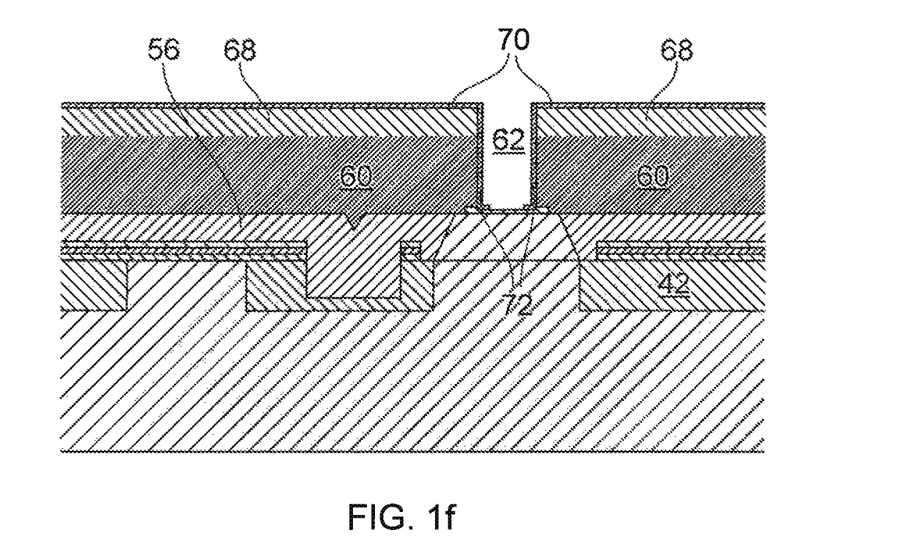
FIG. 1f illustrates a schematic cross-section of the wafer after the step of spacer formation.

Following formation of the emitter window 62, L-shaped spacers 72 are formed on respective sidewalls of the emitter window 62 as shown in FIG. 1f. The L-shaped spacers 72 may be formed of any suitable material, such as for example amorphous silicon and an oxide-nitride-oxide (ONO) layer stack. The ONO stack may be formed for example by 4 nm-10 nm-4 nm thick layers. The upper 4 nm oxide layer and amorphous silicon may be sacrificial in that they are consumed during the etching steps.

The L-shaped spacers 72 define an extrinsic portion of the emitter-base junction of the HBT and prevent out diffusion of implant material in the later deposited emitter material.

Figure 1G:
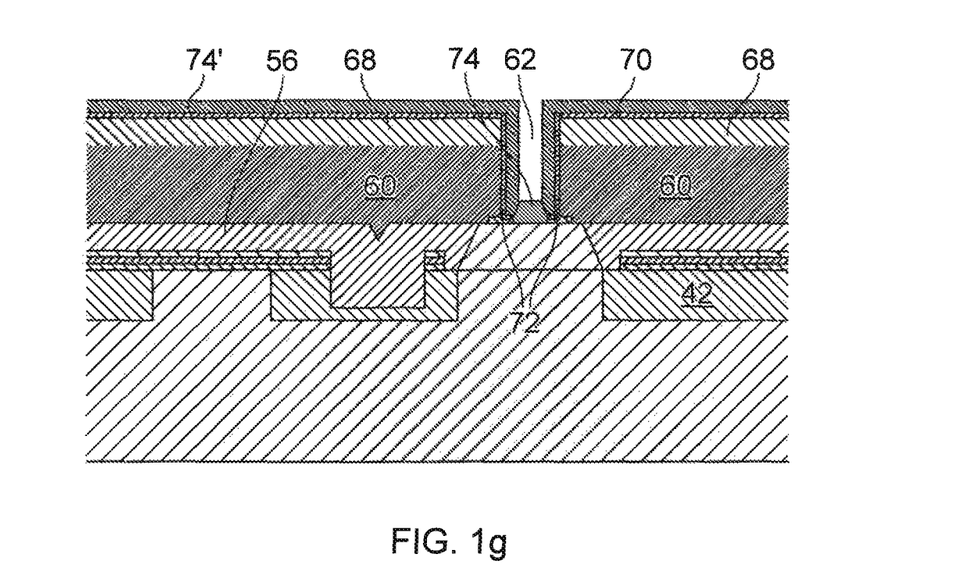
FIG. 1g illustrates a schematic cross-section of the wafer after the step of emitter deposition.

Following formation of the L-shaped spacers 72, the etch protect layer 58 is removed, either partially or completely by a wet etching, such as a HF wet tech. This exposes the crystalline material 56'. As shown in FIG. 1g, the emitter 74 is then deposited, by for example a chemical vapour deposition (CVD) process. As discussed above deposition over the exposed nitride layer 70 and spacers 72 will be polycrystalline 74' whereas deposition over the crystalline material exposed by etching the protect layer 58 will be crystalline 74 The emitter may be any appropriate material such as for example Si.

Figure 1H:
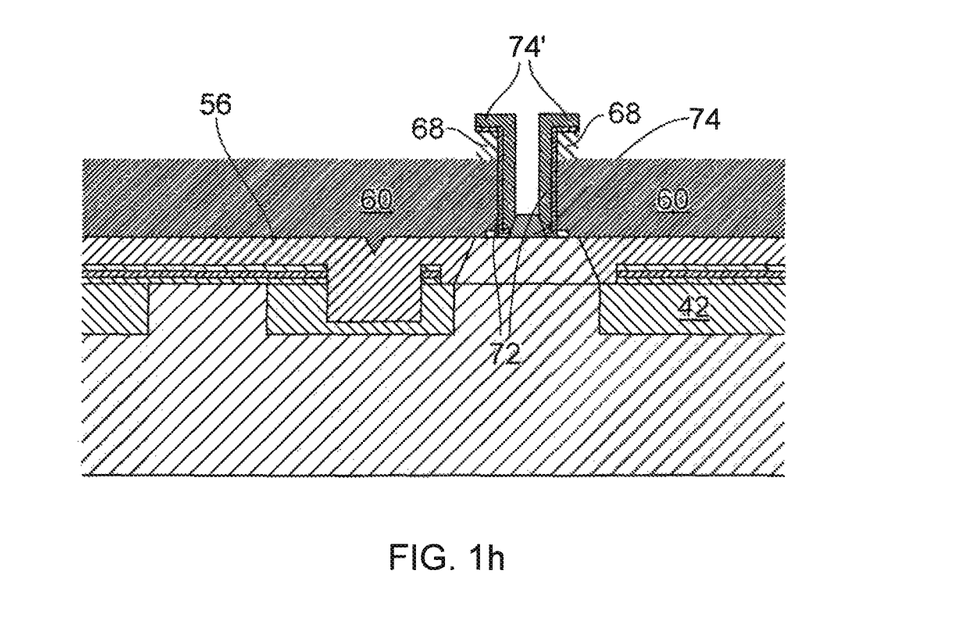
FIG. 1h illustrates a schematic cross-section of the wafer after the step of emitter patterning.

Referring now to FIG. 1h, in the step of emitter processing, also known as emitter patterning, portions of the polysilicon emitter material 74', nitride layer 70 and base oxide layer 68 will be removed from either side of the emitter window 62 region. This step of emitter patterning may be achieved by any appropriate dry etch process.

Figure 1I:
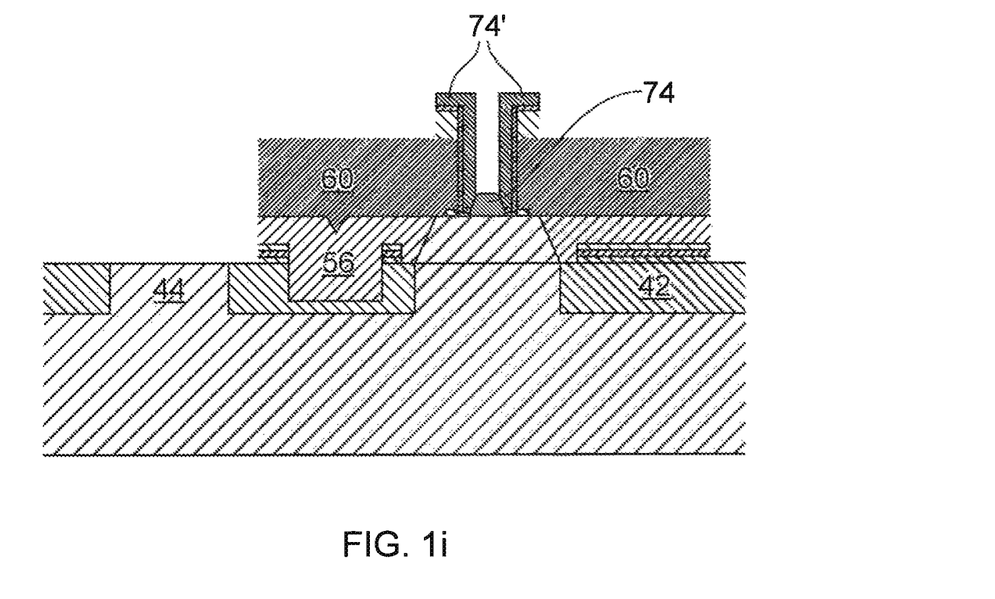
FIG. 1i illustrates a schematic cross-section of the wafer after the step of base patterning.
Figure 1J:
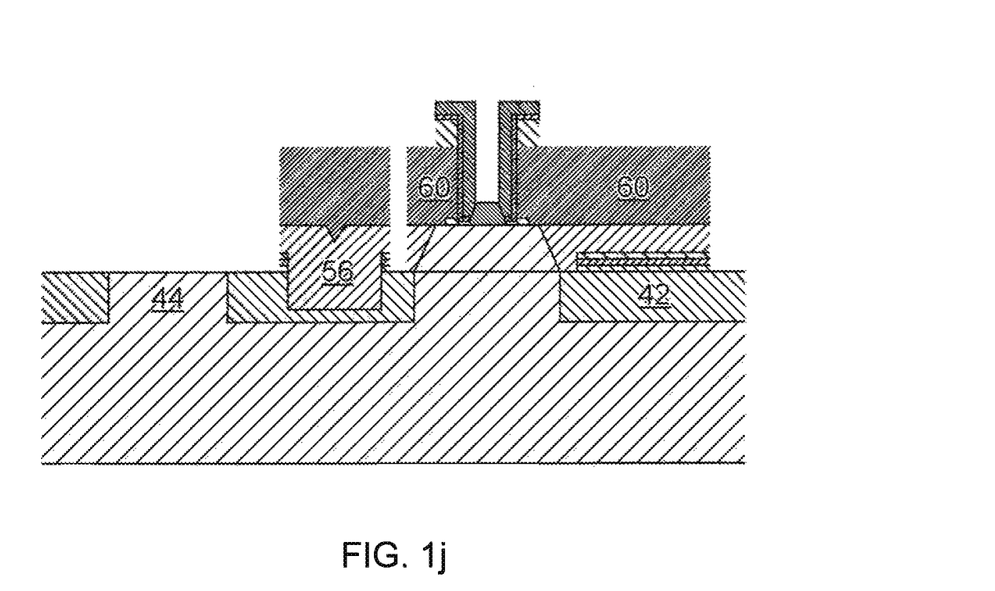
FIG. 1j illustrates a schematic cross-section of the wafer after the step of base patterning for a device having a separate field terminal.

Following emitter patterning, the base polysilicon material 60 and polycrystalline 56 base layers are processed as shown in FIG. 1i to define the field plate. In this processing step, the field plate can either be left connected to the base, or it can be separated in the same processing step to form a gate terminal as illustrated in FIG. 1j. In the case of FIG. 1j a four terminal device is illustrated, whereby the field plate is defined as a separate terminal, to which a separate voltage may be applied which therefore allows for separate biasing of the field plate and thus greater control over suppression of the field spikes. In the case of FIG. 1i the filed plate is not defined as a separate terminal but is connected to the base of the HBT and thus the bias applied to the base will also be applied to the field plate.

Figure 2A:
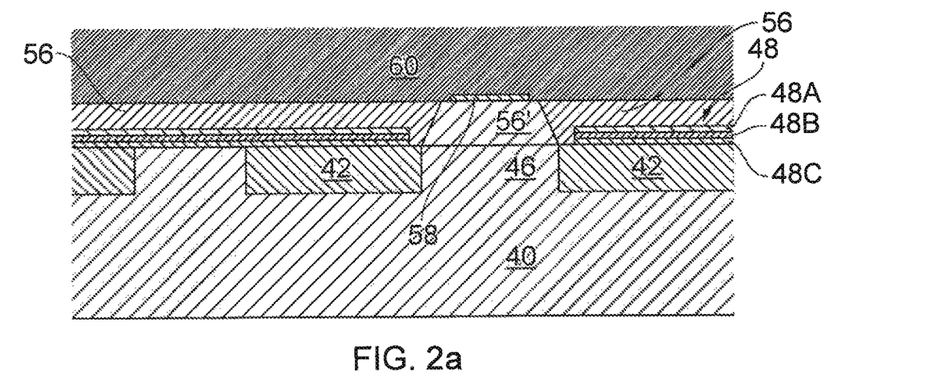
FIG. 2a illustrates a schematic cross-section of the wafer after the step of base polysilicon deposition.

Referring now to FIG. 2a an alternative to the process described above is presented. In common with FIG. 1a above, in FIG. 2a a silicon substrate 40, comprising isolation regions such as shallow trench isolation (STI) regions 42, is provided. The STI regions 42 may be formed in the substrate 40 by any appropriate technique, such as for example by etch an appropriate trench followed by a High Density Plasma (HDP) deposited oxide. The STI regions 42 may define a sinker region 44 and an active bipolar region 46 in the substrate 40 as discussed above.

In common with the process described above, following formation of the STI regions 42, a silicide protect layer 48 is provided on the substrate such that it covers the STI regions 42, the sinker region 44 and the active bipolar region 46. Starting from the lowest layer, that is the layer in contact with the STI regions 42, the DN (sinker) region 44 and the active bipolar region 46, the silicide protect layer 48 is generally formed of a stack comprising: an oxide layer 48C; a nitride layer 48B and a polysilicon layer 48A. In particular, for example the silicide protect layer 48 may be formed of an oxide layer 48C such as TEOS, a nitride layer 48B such as silicon nitride and a polysilicon layer 48A such as amorphous silicon. The main purpose of the silicide protect layer 48 may be to protect the areas of the device already fabricated by CMOS processes from damage during the bipolar processes.

Differing from the process above at the steps presented in FIGS. 1a to 1d, the next step shown in FIG. 2a is that the silicide protect layer 48 is opened. In common with the above process of discussed a window area is formed in photo resist (not illustrated here) over the active bipolar region 46. The width of this window area is such that it is wider than the active bipolar region. The silicide protect layer 48 is then opened by etching as discussed above in relation to FIG. 1a.

Following the opening of the silicide protect layer 48, the next step is base epitaxy, whereby the base terminal of the device is formed by epitaxial growth of a suitable semiconductor material. The base may be formed of any appropriate semiconductor material such as for example SiGe. However, with the exception of the part etched oxide layer 48C at the active bipolar region, the growth of the SiGe will be polycrystalline 56.

With reference to FIG. 2a, the suitable semiconductor material, such as for example SiGe, is grown to form a base of the device. However, with the exception of growth over the exposed material of the active bipolar region 46, which will be crystalline, the growth of the base will be polycrystalline 56. The crystalline growth over the active bipolar region 46 may be due to for example a Si lattice of the active bipolar material.

The remainder of the polycrystalline growth may be due to amorphous layer of the silicide protect layer 48 and oxide layer forming the gate dielectric layer in the STI.

Figure 2B:
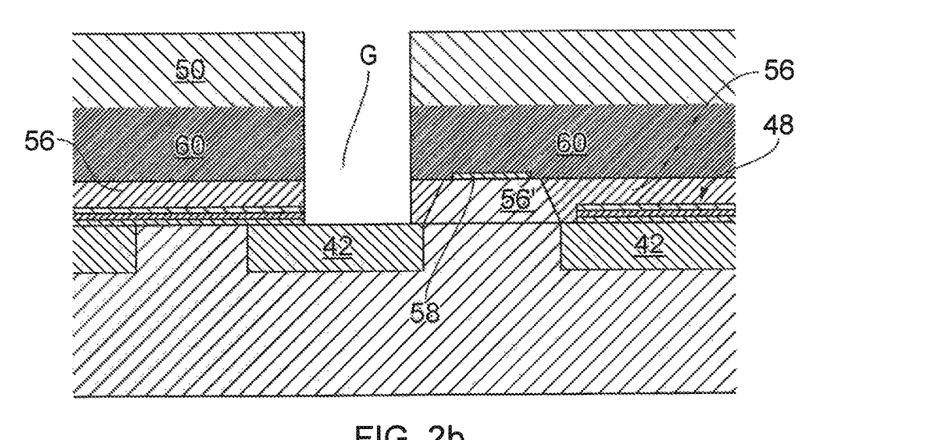
FIG. 2b illustrates a schematic cross-section of the wafer after the step of etching the trench.

Following base epitaxy, an etch protect layer 58 is formed on the crystalline SiGe layer 56' as discussed above. Formation of a device gate then commences. A photo resist layer 50 is then applied over the base polysilicon 60, with the exception of a window area G in the photo resist layer 50 over the STI region 42 between the sinker region 44 and the active bipolar region 46, as shown in FIG. 2b.

Figure 2C:
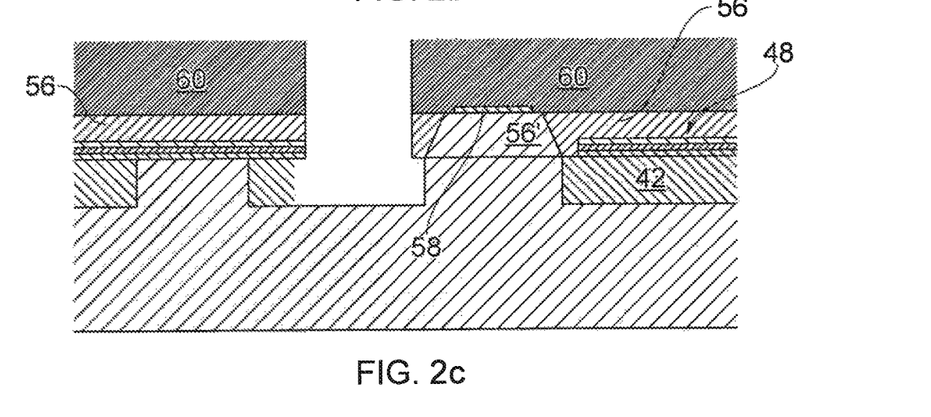
FIG. 2c illustrates a schematic cross-section of the wafer after the step of oxide removal.
Figure 2D:
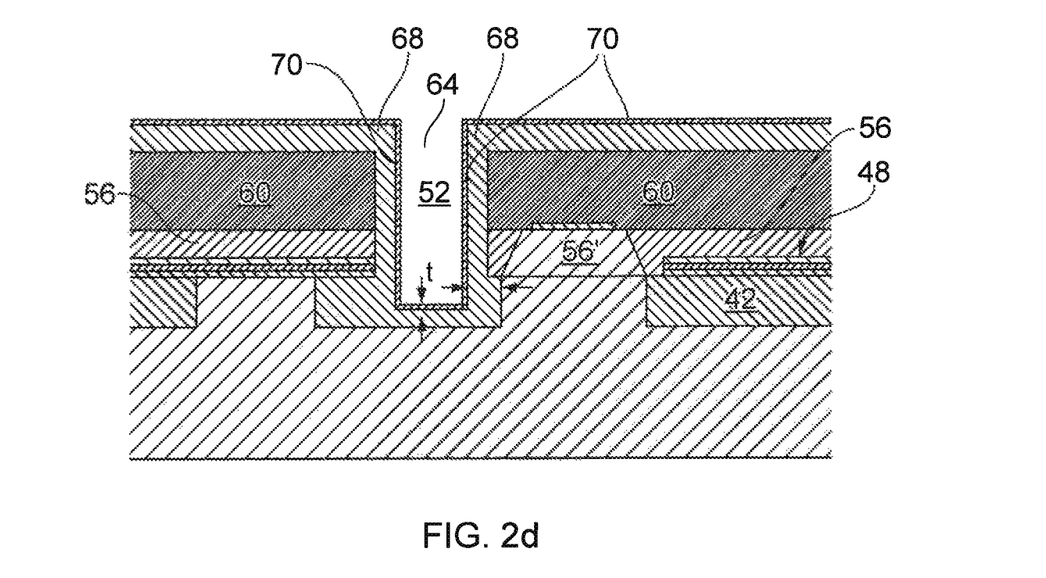
FIG. 2d illustrates a schematic cross-section of the wafer after the step of base oxide and protective nitride layer deposition.

As shown in FIG. 2c, following the application of the photo resist layer 50 a dry etch is used to remove base polysilicon 60 and the silicide protect layer 48 in the area corresponding to the window area 41 in the photo resist layer 50. The dry etch then removes part of the oxide in the STI region 42 corresponding to the window area in the photo resist layer to form a trench 52. The dry etch may be any suitable dry etch process. The dry etch may remove most of the STI oxide in the window 41 (for example a portion of STI oxide of thickness t may remain at the bottom of the trench, as discussed for example above in relation to FIG. 1a). In this case, to remove the remaining and therefore all of the oxide in the STI (that is the thickness t) an appropriate wet etch, such as a HF etch is applied to the oxide in the STI.

Where the complete oxide thickness is completely removed by a wet etch, a further oxide layer 68 is then deposited at the bottom and sidewalls of the trench 52 so as to partially fill the trench 52 as shown in FIG. 2d. The oxide layer 68 may be any appropriate material, for example a silicon oxide such as TEOS. Compared to the example of FIG. 1a, formation of the oxide thickness tin the example of FIG. 2d is not determined by an etching process, but rather a deposition process which provides greater control over the oxide thickness t. Therefore, by having control over the oxide layer 68 thickness it is possible optimise the breakdown voltage $BV_{CBO}$.

The further oxide layer 68 extends over the surface of the base polysilicon 60. A nitride layer 70 is then applied over the further oxide layer 68. The nitride layer 70 may be for example SiN, and may protect the further oxide layer 68 below during subsequent processing steps such as etching of the emitter window. The further oxide layer 68 defines the gate dielectric (or oxide layer thickness) of the gate of the HBT device and therefore defines a field plate for controlling the breakdown voltage $BV_{CBO}$ of the HBT device.

Figure 2E:
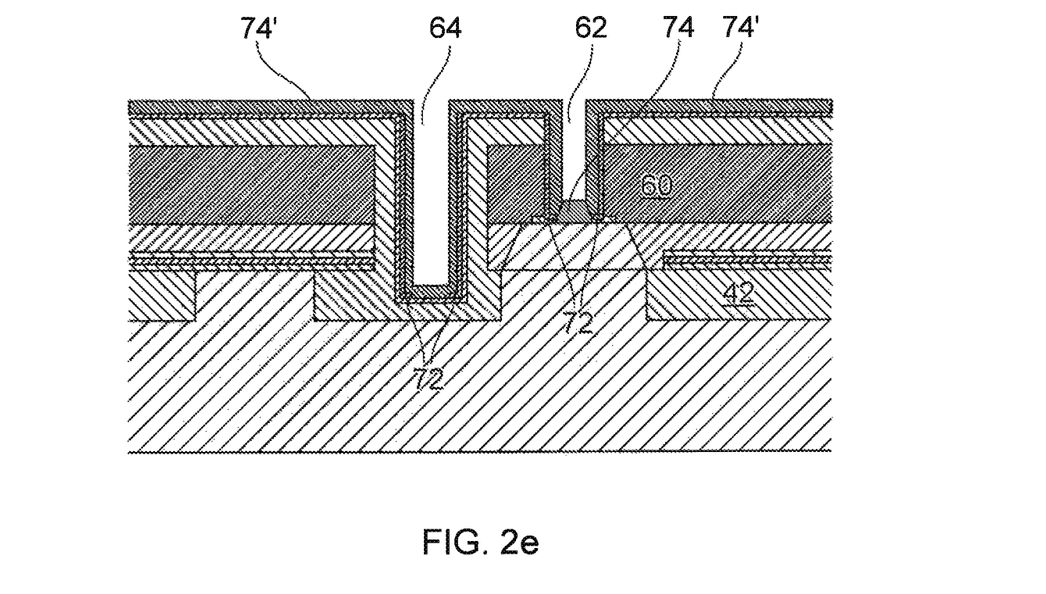
FIG. 2e illustrates a schematic cross-section of the wafer after formation of the emitter.

The field plate may therefore be defined by the following process. Oxide 68 is deposited on respective sidewalls of the trench 52. A nitride layer 70 is then applied to the oxide layer 68. Following application of the nitride layer 62 the next step in the process may be formation of the emitter window 62 and further the gate windows 64. The steps of this process have been discussed above in relation to FIG. 2e. L-shaped spacers 72 are formed on respective sidewalls of the emitter window 62 and gate window 64. Emitter material 74, 74' is then deposited. Deposition over the exposed nitride layer 70 and spacers 72 will be polycrystalline 74' whereas deposition over the crystalline material exposed by etching the protect layer 58 at the bottom of the emitter window will be crystalline 74. The emitter material 74, 74' may be any appropriate material such as for example Si.

As for the process of FIGS. 1a to 1d the formed field plate in the gate window can be either left connected, in this case to the emitter, or be cut in the emitter patterning process step, to form a fourth terminal of the HBT. This separate terminal can therefore be independently biased from the collector, base and emitter terminals of the HBT. In use the bias of the gate and therefore the field plate can be tuned for optimal field distribution. This can result in maximum breakdown voltage for a particular gate oxide thickness.

In the foregoing, the field plate may be either a doped base polycrystalline 56 or a doped emitter polycrystalline material 74'. In the case of a base polycrystalline 56 the material may be doped p-type. In the case of an emitter polycrystalline material 74' the material may be doped n-type.

Figure 3:
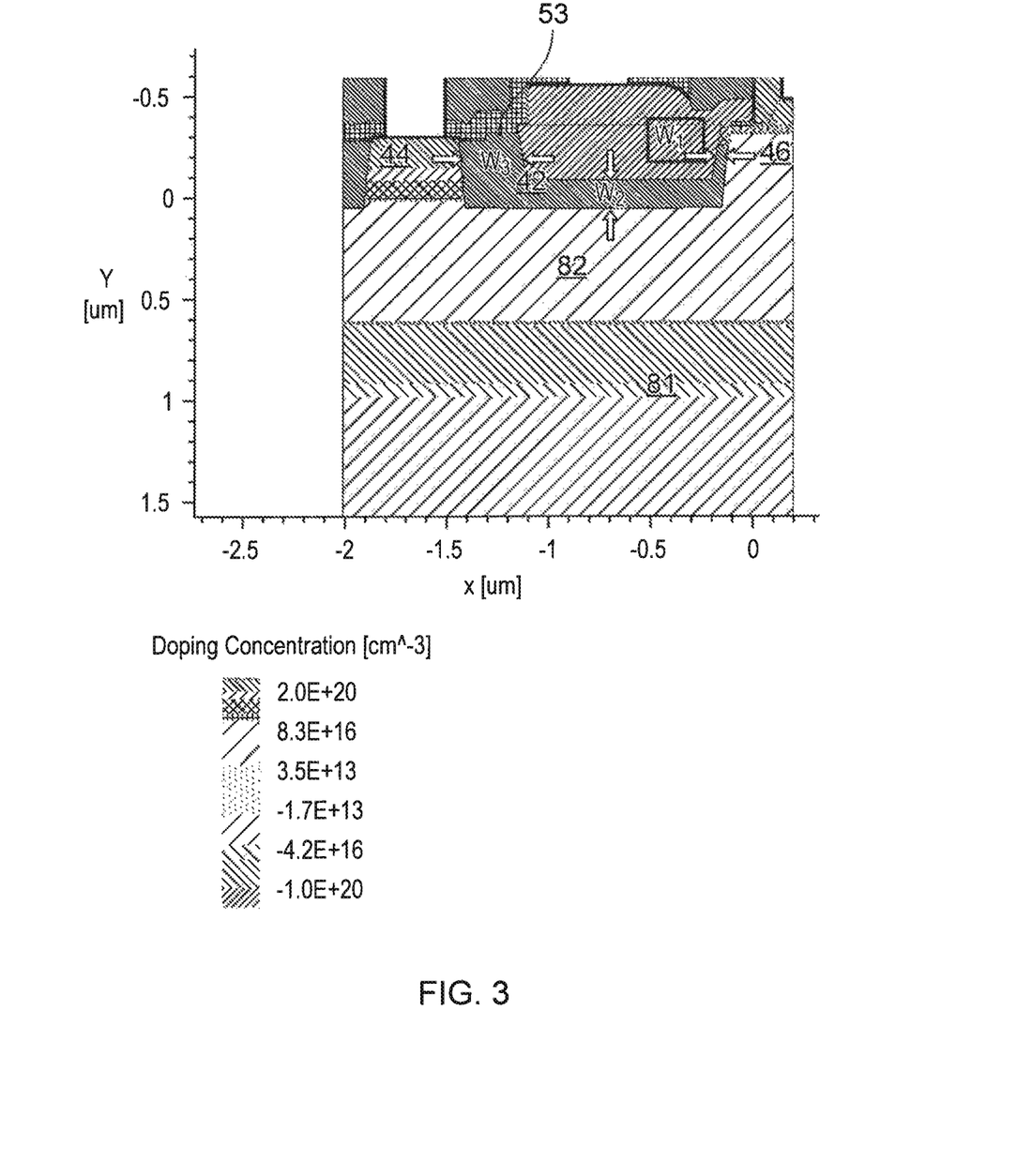
FIG. 3 illustrates a schematic cross section of a HBT device structure according to an embodiment.

Turning now to FIG. 3, a structure of the HBT device, is shown. Generally, the HBT device is a lateral collector type device, that is, a semiconductor substrate 81 that may comprise a collector region 82 formed by epitaxial growth on, or implantation in the substrate 81. The substrate may be an n-type silicon substrate which may be doped with an n-type impurity such as arsenic As. Alternatively the substrate could be a p-type silicon substrate doped with a p-type impurity such as boron B. The substrate 81 may also comprise isolation regions such as the STI regions discussed above which typically define, there between, the active bipolar region 46 of the device. The isolation regions 42 may also serve to define a sinker region 44 which serves to connect a collector terminal of the HBT device to the collector region 82. The sinker region should be the same conductivity type as collector region 82. For example where the collector region is n-type, the sinker region 44 will also be n-type, for example a deep layer n-type (DN) formed by implantation of for example As, although the skilled person will understand that the sinker region can be formed by any appropriate steps.

An emitter region of the HBT device is formed on the active bipolar region 46 as discussed above.

The gate of the HBT device is formed in an isolation region 42 between the sinker region 44 and the active bipolar region 46, the process for such formation has been discussed above. The gate comprises the field plate formed of an oxide layer 53.

Figure 4:
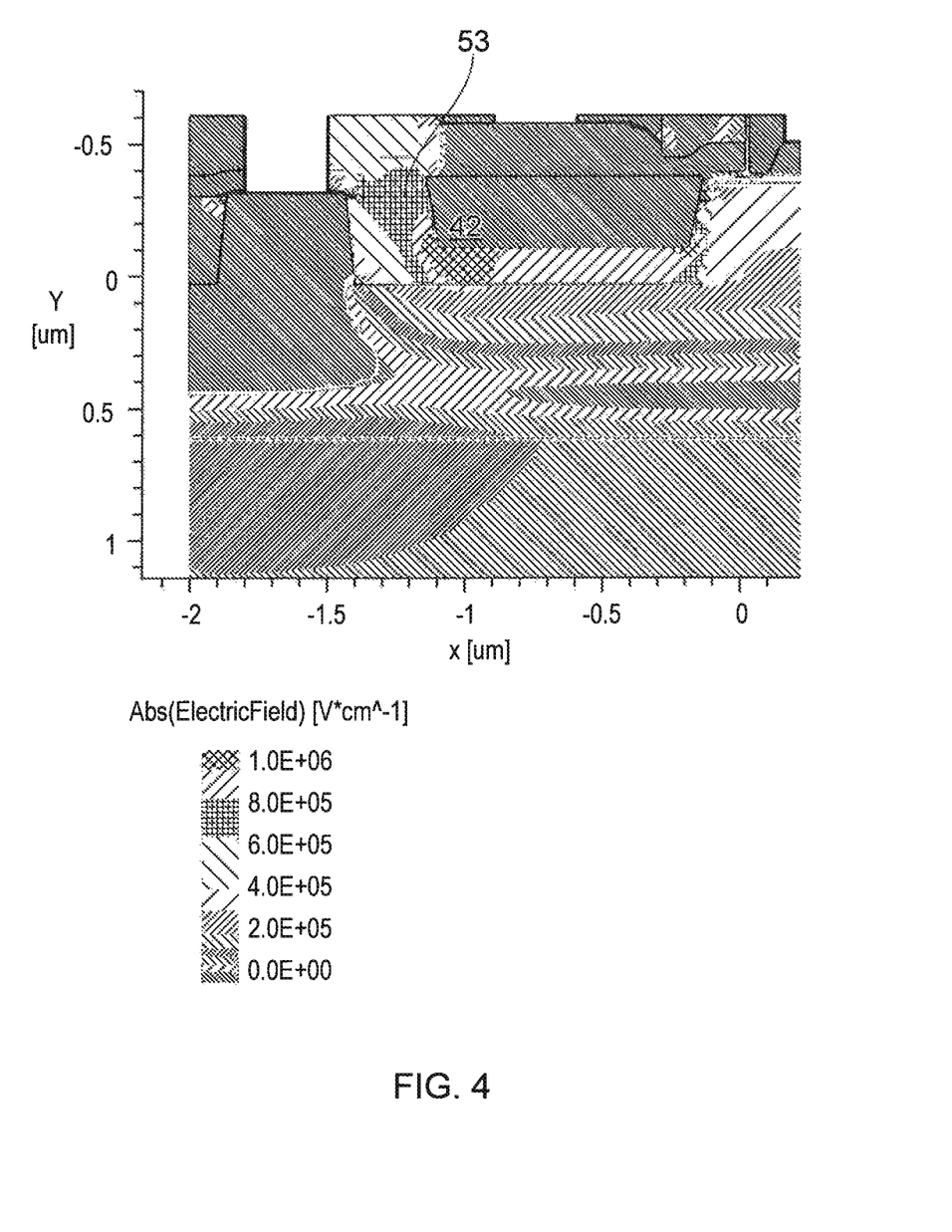
FIG. 4 illustrates a simulated device off state electric field distribution for the HBT device structure of FIG. 3.

Referring now to FIG. 4, show a simulation of electric field distribution for the device of FIG. 3, wherein the base-emitter voltage ($V_{BE}$) of 0V and a collector-base voltage ($V_{CB}$) of 20V (in other words no current will flow in the device). As a result of the oxide layer 53 field spikes are reduced in the gate at the junction of the oxide at the base-collector. Instead the field is now uniformly spread in the whole collector region.

As illustrated in FIG. 3, the shape of oxide layer in the gate region may be arranged for example such that it may have three portions, indicated generally by the thicknesses W1, W2 and W3, where W2 corresponds to the thickness t discussed above. The field plate may be arranged such that it is thin at the region of high electric field, that is at the interface of the active bipolar region 46, and thicker at the regions of low electric field, that is away from the active region, for example at base of the isolation region and at the junction of the sinker. Such a configuration may give rise to an optimum reduced surface field (RESURF) effect at maximum breakdown voltage.

The oxide thicknesses W1, W2 and W3 are important because they influence the degree you can influence the electric fields inside the collector regions 46, 82 and 44. The thinner the oxide, the higher the impact of the biasing potential on the field plate has on the electric field.

By way of example, the thickness W1 of the oxide at the interface of the active bipolar region 46 may be less than 150 nm. The thickness W2 of the oxide at the bottom of the gate may be in the region of 150 nm. The thickness W3 of the oxide adjacent the collector terminal may be in the region of 300 nm to 500 nm. Optimally, for a HBT device with a drift region of 1.2 μm and in the case of a npn type device an n-type doping at the drift region of approximately $4 \times 10^{16}$ cm$^{-3}$ the breakdown voltage $BV_{CBO}$ may be approximately 44V. For ease of explanation the L-shaped spacers in the gate are not illustrated in FIG. 3.

The skilled person will appreciate therefore that the thickness W1 (that is the gate oxide thickness in the base of the gate trench) influences the ability to control field spikes and the consequent effect on breakdown voltage of the device. Furthermore, with the device and method described, it is possible to provide a field plate that covers the collector base junction with the thickness of gate dielectric required for a specific requirement of breakdown voltage and cut-off frequency.

The example here shows a case of gate connected to base. The gate and base may be separated as understood by those skilled in the art.

In conclusion, a device and process for manufacturing a HBT device with a gate dielectric or field plate are disclosed, where the field plate may control or effect the performance of the device.

Particular and preferred aspects of the invention are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed invention or mitigates against any or all of the problems addressed by the present invention. The applicant hereby gives notice that new claims may be formulated to such features during prosecution of this application or of any such further application derived there from. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

The invention claimed is:

1. A bipolar transistor, comprising:
an active region;
a collector region;
a sinker region serves to connect a collector terminal;
a substrate comprising an isolation region having a first side wall adjacent to said active region, a second side wall adjacent to said sinker region, and a base adjacent to said collector region;
a dielectric disposed on said first and second side walls and said base, said dielectric having a first thickness on said first sidewall, a second thickness on said base and a third thickness on said second sidewall, wherein said first thickness is thin relative to said second and third thicknesses, and said third thickness is thick relative to said second and first thicknesses;
a field plate formed of a semiconductor material in said isolation region, wherein said field plate is adjacent to a base-collector junction of said active region;
wherein said dielectric defines a gate dielectric proximal to said base-collection junction.

2. The bipolar transistor of claim 1 wherein said semiconductor material is a polycrystalline semiconductor material.

3. The bipolar transistor of claim 2, wherein said polycrystalline semiconductor material comprises a base or an emitter of said bipolar transistor.

4. The bipolar transistor of claim 1, wherein said gate dielectric and said semiconductor material define a gate terminal of said transistor.

5. The bipolar transistor of claim 4, said gate terminal is arranged to be biased independently of a collector, base or emitter terminal of said transistor.

\* \* \* \* \*